United States Patent
Ono

[11] Patent Number: 5,858,827
[45] Date of Patent: Jan. 12, 1999

[54] METHOD OF MANUFACTURING MOS TRANSISTOR DEVICE WITH IMPROVED THRESHOLD VALUE CONTROL AND REDUCED REVERSE SHORT CHANNEL EFFECT

[75] Inventor: Keiichi Ono, Kanagawa, Japan

[73] Assignee: Sony Corporation, Tokyo, Japan

[21] Appl. No.: 863,868

[22] Filed: May 27, 1997

Related U.S. Application Data

[63] Continuation of Ser. No. 534,247, Sep. 26, 1995, abandoned.

[30] Foreign Application Priority Data

Sep. 29, 1994 [JP] Japan ..................... 6-234979

[51] Int. Cl.$^6$ ................ H01L 21/8238; H01L 21/336
[52] U.S. Cl. ........................... 438/232; 438/306
[58] Field of Search .................. 438/232, 306, 438/231, 305

[56] References Cited

U.S. PATENT DOCUMENTS

| | | | |
|---|---|---|---|
| 4,928,156 | 5/1990 | Alvis et al. ........................ | 257/344 |
| 5,308,780 | 5/1994 | Chou et al. ........................ | 437/35 |
| 5,320,974 | 6/1994 | Hori et al. ........................ | 437/35 |
| 5,372,957 | 12/1994 | Liang et al. ........................ | 437/35 |
| 5,432,114 | 7/1995 | O ........................ | 437/57 |
| 5,472,887 | 12/1995 | Hutter et al. ........................ | 437/57 |

OTHER PUBLICATIONS

Stanley Wolf, Silicon Processing for the VLSI Era, vol. 3, 226–232, 1995.

Primary Examiner—Brian Dutton
Attorney, Agent, or Firm—Hill & Simpson

[57] ABSTRACT

A method of manufacturing MOS semiconductor device, is disclosed, in which considerations are given to the influence of threshold value on ion implantation, and the dose of impurity to be ion implanted for forming high impurity concentration regions as source and drain regions is set to a value, at which the threshold value is substantially constant with impurity dose changes (the impurity dose being set to $10^{15}$ per cm$^2$ or below for n-type impurity region). Thus, it is made possible to adequately set and control the threshold value, thus solving particularly the problem of reverse short channel effect and permitting formation of MOS parts with different threshold values.

6 Claims, 5 Drawing Sheets

PROCESS IN THIRD EMBODIMENT
(P-CHANNEL SOURCE/DRAIN REGION FORMATION ION IMPLANTATION)

PROCESS IN THIRD EMBODIMENT
(N-CHANNEL SOURCE/DRAIN REGION FORMATION ION IMPLANTATION)

FUNCTION OF FIRST EMBODIMENT
(RELATION BETWEEN SOURCE/DRAIN ION
IMPLANTATION AND THRESHOLD ROLL-UP)

FUNCTION OF FIRST EMBODIMENT
(RELATION BETWEEN THRESHOLD VALUE
AND CHANNEL LENGTH)

PROCESS IN THIRD EMBODIMENT
(P-CHANNEL SOURCE/DRAIN REGION FORMATION ION IMPLANTATION)

PROCESS IN THIRD EMBODIMENT
(N-CHANNEL SOURCE/DRAIN REGION FORMATION ION IMPLANTATION)

METHOD OF MANUFACTURING MOS TRANSISTOR DEVICE WITH IMPROVED THRESHOLD VALUE CONTROL AND REDUCED REVERSE SHORT CHANNEL EFFECT

This is a continuation of application Ser. No. 08/534,247, filed Sep. 26, 1995, now abandoned.

BACKGROUND OF THE INVENTION

1. Field of the Invention

This invention relates to a method of manufacturing MOS transistor device and also to the same MOS transistor device.

2. Description of the Related Art

Heretofore, in the manufacture of MOS transistor, the diffusion layer formation step was carried out with main emphasis placed on reducing the resistivity and making the junction shallower. Particularly, with respect to the former there have been developed many techniques inclusive of silicide formation. As for the formation of junction, ion implantation is used mostly for obtaining shallow junction. In this case, the implantation ion dose is usually set to 3 to $5 \times 10^{15}$ per $cm^2$ to hold a low resistivity. This is made so for realizing low resistivity, and there has been no particular discussion about the influence of this on tranasistor. A sole consideration that is paid is to make junction shallow for suppressing the short channel effect.

However, it has been made obvious that the dose of implantation of ions for the diffusion layer formation has influence on transistor. This influence is a "reverse short channel effect" which has been a recent topic of discussion. Specifically, this phenomenon is that the threshold value Vth is reduced with increasing gate length. Concerning this phenomenon, there are many reports, such as H. I. Hanafi et al, "A Model for Anomalous Short-Channel Behavior in Submicron MOSFETs", IEEF Electron Device Letters, Vol. 14, No. 12, 1993, pp. 575-. However, its mechanism is not clear and explained variously.

In addition, it is difficult to reproduce the phenomenon even with simulation equipment which is an important development tool. Therefore, the development has been becoming useless as such. However, the control of the threshold value is a most important subject in low voltage operation. It is thus necessary for this reason as well to suppress the reverse channel effect (see, for instance, Nikkey Microdevices, February 1994, pp. 75).

OBJECTS AND SUMMARY OF THE INVENTION

An object of the invention is to provide a MOS semiconductor device and a method of manufacturing the same, which give consideration to the influence of the ion implantation on the threshold value and permit adequate threshold voltage setting and control.

A second object of the invention is to provide a MOS semiconductor device and a method of manufacturing the same, which can solve the problem of reverse short channel effect of MOS FET.

A third object of the invention is to provide a MOS semiconductor device and a method of manufacturing the same, in which it is possible to permit formation of MOS devices with different threshold values.

To attain the above objects of the invention, there is provided a method of manufacturing MOS semiconductor device, in which the impurity dose of ion implantation for forming high impurity concentration regions as source and drain regions of a MOS semiconductor device is set to at least a value, in which the threshold voltage is substantially constant with impurity dose changes.

To attain the above objects of the invention, there is also provided a method of manufacturing MOS semiconductor device, in which the impurity does is set to $10^{15}$ $cm^2$ for n-type impurity regions.

To attain the above objects of the invention, there is further provided a method of manufacturing MOS semiconductor device, which permits formation of MOS semiconductor devices having different threshold values by varying the impurity dose of ion implantation for forming high impurity concentration regions as source and drain regions of the MOS semiconductor devices.

To attain the above objects of the invention, there is still further provided a method of manufacturing a MOS semiconductor device having a P-channel MOS transistor and an N-channel MOS transistor, in which high impurity concentration regions as source and drain regions of the P-channel MOS transistor are formed by causing ion implantation of an impurity for forming a p-type impurity region and an impurity for forming an n-type impurity region with the p-type impurity region formation impurity concentration set to be higher, the same ion implantation is caused for forming source and drain regions of the N-channel MOS transistor, and subsequently ion implantation of an impurity for forming n-type impurity region is caused only in regions for forming source and drain regions of the N-channel MOS transistor with the P-channel MOS transistor used as mask.

To attain the above objects of the invention, there is yet further provided a MOS semiconductor device having two or more MOS transistors, in which different threshold voltage structures are provided for the impurity regions for forming source and drain regions of the individual MOS transistors by setting different impurity doses of ion implantation for the individual MOS transistors.

To attain the above objects of the invention, there is further provided a MOS semiconductor device having a P-channel MOS transistor and an N-channel MOS transistor, the P-channel MOS transistor having source and drain impurity regions formed through simultaneous ion implantation of an impurity for p-type impurity region and an impurity for n-type impurity region with the p-type impurity region formation impurity concentration set to be higher, the N-channel MOS transistor having source and drain impurity regions formed by causing ion implantation of n-type impurity region formation impurity into regions obtained through ion implantation of the P-channel MOS transistor source and drain impurity region formation impurities.

According to the invention, the impurity dose of ion implantation for forming high impurity concentration regions as source and drain regions of a MOS semiconductor device is set at least to a value, at which the threshold voltage is substantially constant with impurity dose changes (for instance to $10^{15}$ per $cm^2$). It is thus possible to set and control the threshold voltage adequately, so that it is possible to solve the problem of reserve shoft channel effect in MOS semiconductor devices.

Further, it is possible to permit formation of MOS semiconductor devices having different threshold voltages. For example, in the manufacture of a MOS semiconductor device having a P-channel MOS transistor and an N-channel MOS transistor, it is possible to provide for different threshold values for the respective MOS transistors or for two or more channels, for instance, MOS transistors.

DETAILED DESCRIPTION OF THE PREFERRED EMBODIMENTS

A first embodiment of the invention will now be described with reference to the drawings. It is of course to be understood that the illustrated embodiment is by no means limitative.

In this embodiment, MOS transistor is formed on the basis of the inventor's finding that there exists a correlation between the ion implantation at the time of diffusion layer formation and the reverse short channel effect phenomenon.

Figure 1:
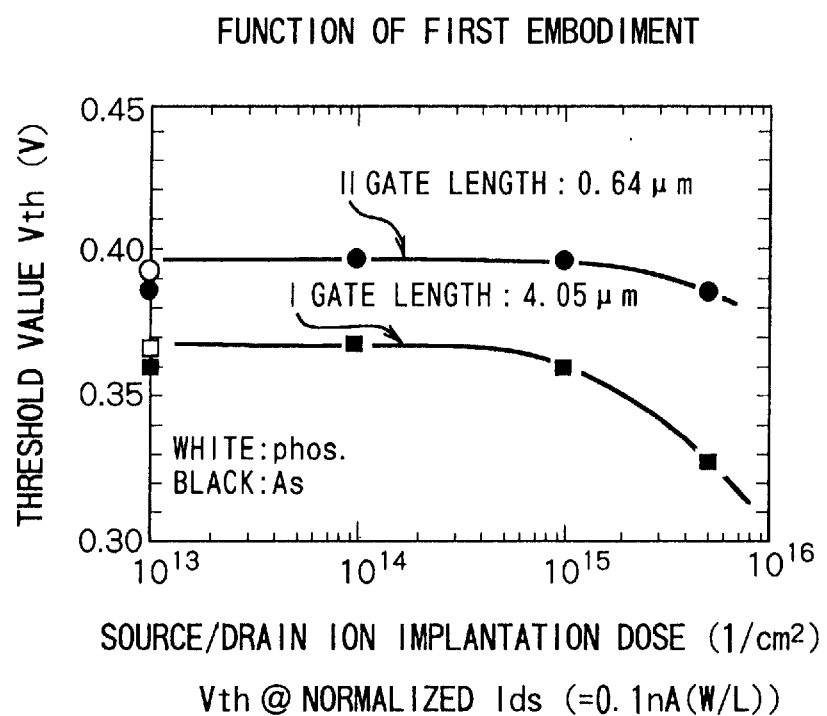
FIG. 1 is a graph showing the threshold value of MOS transistor in a first embodiment of the invention.

Reference is now had to FIG. 1, which is a graph showing the relation between the source/drain ion implantation dose and reverse short channel effect. In the graph, the ordinate is taken for the threshold value Vth, and the abscissa is taken for the dose. The relation is plotted for case I in which the gate length is 4.05 $\mu$m and case II in which the gate length is 0.64 $\mu$m.

As shown in FIG. 1, as for the impurity dose of ion implantation for forming high impurity concentration regions as source and drain regions of MOS semiconductor device, in a certain impurity dose range the threshold value is substantially fixed. As is seen from FIG. 1, as for the n-type impurity region this is the case with impurity doses of $10^{15}$ per cm$^2$ and below. Accordingly, in this embodiment in the formation of MOS transistor the impurity dose is set in the range noted above, thus permitting adequate setting and control of the threshold voltage and solving the reverse short channel problem in MOS semiconductor devices.

Figure 2:
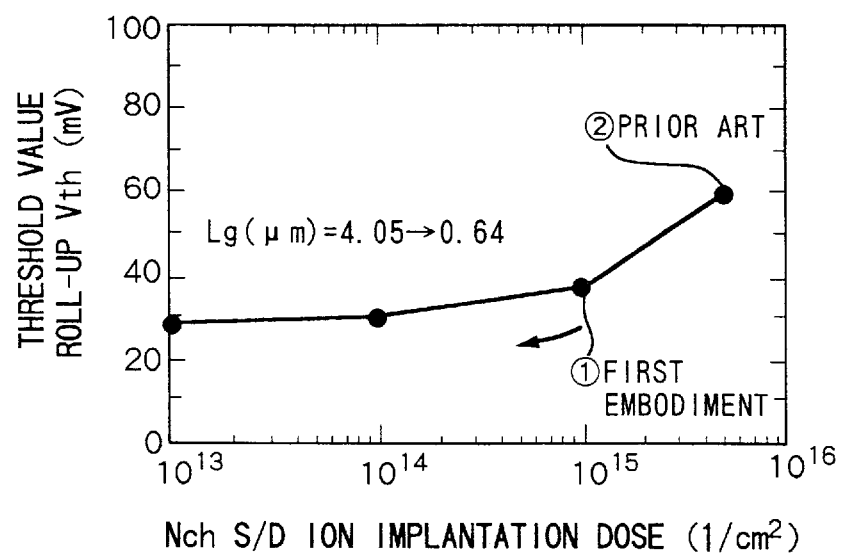
FIG. 2 is a graph showing the threshold roll-up of MOS transistor in the first embodiment of the invention.

FIG. 2 shows the roll-up of the threshold value Vth shown in FIG. 1 (i.e., the degree of reverse short channel effect). It will be seen from FIG. 2 that by setting the dose to $10^{15}$ per cm$^2$ as in the first embodiment as shown by (1), the reverse short channel effect can be reduced to one half compared to the prior art case as shown by (2).

Figure 3:
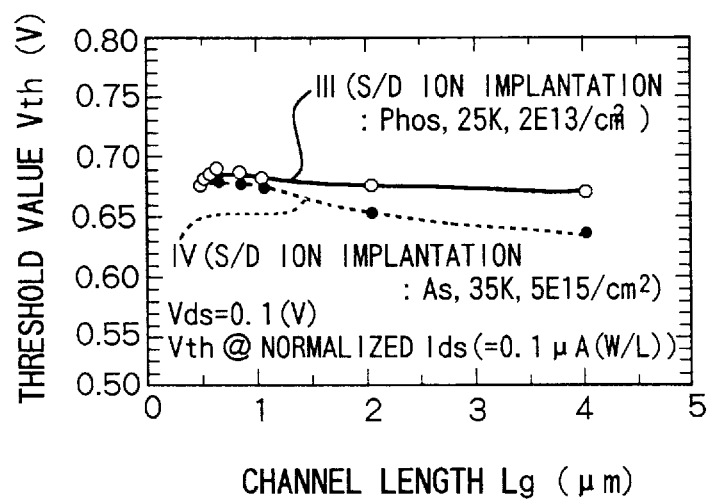
FIG. 3 is a graph showing the relation between the threshold value and channel length of MOS transistor in the first embodiment of the invention.

FIG. 3 shows the relation between the threshold value Vth (in V) and the channel length (in m). Plot III is obtained with this embodiment, and plot IV is obtained in the prior art. As shown, in the relation between the ion implantation for diffusion layer formation (i.e., ion implantation for the source and drain region formation) and the reverse short channel effect, with this embodiment in which the dose of ion implantation is $2\times10^{13}/\text{cm}^2$ the threshold value is less changed with channel length changes compared to the prior art case in which the ion implantation dose is $5\times10^{15}/\text{cm}^2$, thus showing that in this embodiment the reverse short channel effect is suppressed. Specifically, in transistors manufactured in the general method, the threshold value Vth is reduced by about 50 mV with a gate length change from 1 to 4 $\mu$m. This reduction stems from the process and causes fluctuations of the threshold value Vth. In contrast, with transistors manufactured on the basis of this embodiment, the reverse short channel effect is substantially eliminated as is seen from the plot III.

The process of semiconductor manufacture in this embodiment is shown below.

In this embodiment, MOS transistor was manufactured in steps (1) to (17).

(1) Element isolation region is formed.
(2) P-well is formed.
(3) Semiconductor substrate (here silicon substrate) is doped with an impurity (here boron up to $10^{17}$ per cm$^3$).
(4) Gate oxide film is formed (to a thickness up to 10 nm).
(5) Gate electrode is formed. Here, a structure of WSi 100 nm/phosphorus-doped polySi 100 nm was adopted.
(6) Ion implantation for LDD region formation is done. Here, As$^+$ was implanted at 30 KeV to $3\times10^{13}$ per cm$^2$. The ion implantation was made as 30° off, i.e., 30° oblique, ion implantation.
(7) Side wall was formed (with a thickness of 100 nm).
(8) Source/drain ion implantation was made. Here, As$^+$ was implanted at 35 KeV, or P$^+$ was implanted at 25 KeV. The dose of ion implantation was set to $10^{13}$ to $10^{15}$ per cm$^2$.
(9) Annealing is made (800° C., N$_2$, 10 min.).
(10) Inter-layer film is formed.
(11) Contact holes are formed.
(12) Forming annealing is made (400° C., for, 60 min.).
(13) Annealing is made (900° C., N$_2$, 10 min.).
(14) Leads are formed.
(15) Forming annealing is made (400° C., for, 60 min.).
(16) Passivation film is formed. Here, p-SiN film was formed to a thickness of 750 nm.
(17) Pad holes are formed.

In the above process, the LDD region formation may be dispensed with.

In this embodiment, by setting the dose of impurity implantation for forming diffusion regions as source and drain regions to $10^{15}$ per cm$^2$ or below, it was possible to suppress the reverse short channel effect and improve the property of control of the threshold value Vth.

A second embodiment will now be described. In this embodiment, the phenomenon described above is conversely made use of for the control of the threshold value Vth. Specifically, the dose of ion implantation for forming source and drain regions was varied to vary the threshold value Vth for desired MOS transistor.

The procedure of the method of manufacture is the same as in the preceding first embodiment, and thus its detailed description is not given.

A third embodiment of the invention will now be described.

In this embodiment, a desired MOS semiconductor device is obtained which, in addition to using the process in the second embodiment, has two or more MOS parts, i.e., MOS transistors, with different threshold values Vth.

Figure 4:
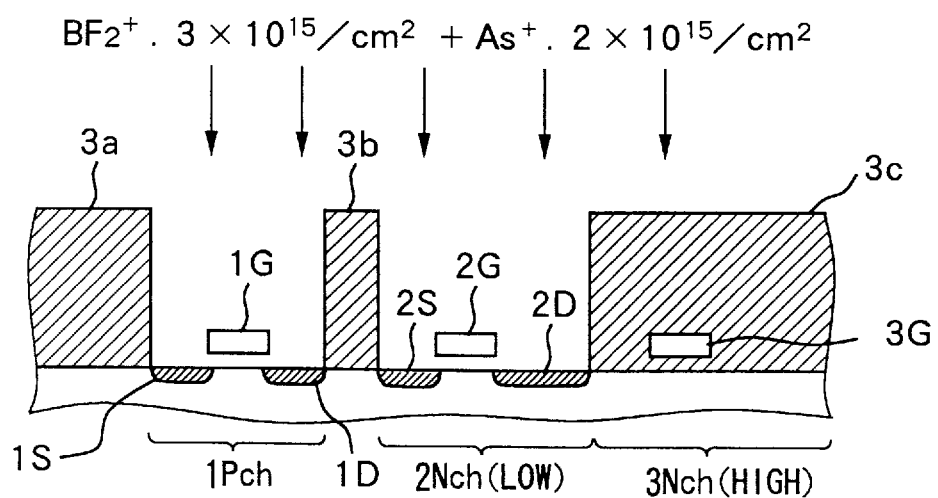
FIG. 4 is a view showing a step of MOS transistor manufacture in a third embodiment of the invention.
Figure 5:
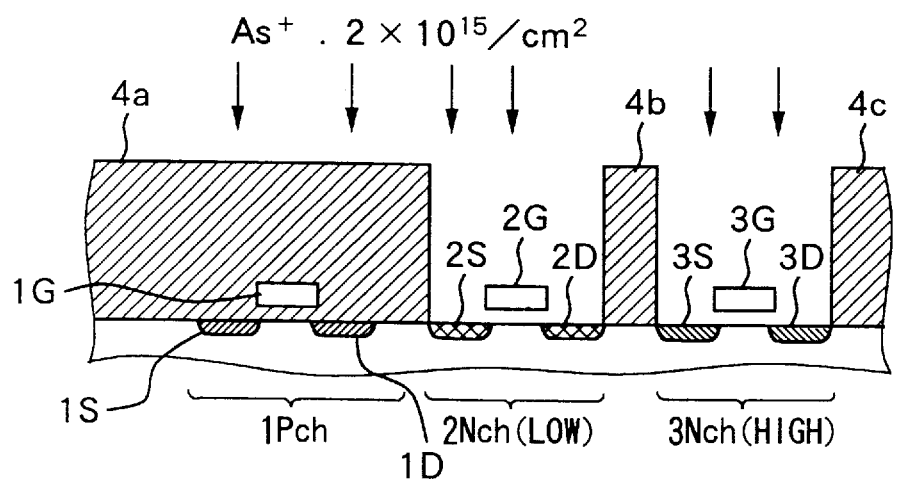
FIG. 5 is a view showing a step of MOS transistor manufacture in the third embodiment of the invention.

FIG. 4 illustrates a subsequent step of ion implantation for P-channel source and drain region formation, and FIG. 5 illustrates a step of ion implantation for N-channel source and drain region formation.

Referring to FIGS. 4 and 5, reference numerals 1G, 1S, 1D (collectively "1") generally designates a P-channel MOS transistor, and 2G, 2S, 2D (collectively "2") and 3G, 3S, 3D (collectively "3") N-channel MOS transistors.

As shown, this embodiment concerns a MOS semiconductor device having the P-channel MOS transistor 1 and N-channel MOS transistors 2 and 3. The P-channel MOS transistor 1 has its source 1S and drain 1D impurity regions formed by causing simultaneous ion implantation of an impurity for providing for p-type impurity region and an impurity for providing for n-type impurity region with the concentration of the p-type impurity region formation impurity set to be higher. The N-channel MOS transistor 2 has its source 2S and drain 2D regions formed by causing ion implantation of an n-type inpurity region formation impurity into regions obtained as a result of the impurity ion implantation for the formation of the source 2S and drain 2D impurity regions of the N-channel MOS transistor 2.

More specifically, high impurity concentration regions as source and drain regions 1S and 1D of P-channel MOS transistor 1 are formed b ion implanting an impurity for p-type inpurity region formation and an impurity for n-type impurity region formation by setting the p-type impurity region formation impurity concentration to be higher. Like ion implantation is made for regions as source and drain regions 2S and 2D of N-channel MOS transistor 2. Subsequently, n-type impurity region formation impurity is ion implanted into only the source and drain region formation regions 3S and 3D of the N-channel MOS transistor 3 as shown in FIG. 3.

This MOS semiconductor device has two or more N-channel MOS transistors 2, 3 . . . . These N-channel MOS transistors have different threshold voltages set by different ion implantatin doses of impurities for forming their source and drain regions (i.e., regions 2S and 2D, 2S and 3D, . . . ).

In this embodiment, the process involves two mask-using steps, i.e., the step using photo-resists 3a, 3b and 3c (FIG. 4) and the step using photo-resists 4a, 4b and 4c (FIG. 5), and there is no need of increasing the number of photo-resists.

More specifically, in this embodiment p- and n-type impurities are ion implanted in the step of ion implantation for forming P-channel source and drain regions shown in FIG. 4. In this case, however, the dose of the p-type impurity is set to be higher than that of the n-type impurity so that the overall conductivity type is p-type. Specifically, $BF_2^+$ was ion implanted with the dose thereof set to $3 \times 10^{15}$ per $cm^2$, while simultaneously ion implanting $As^+$ with the dose thereof set to $2 \times 10^{15}$ per $cm^2$.

In a subsequent step of ion implantation for forming N-channel source and drain regions shown in FIG. 5, n-type impurity is ion implanted. Specifically, $A_S^+$ was ion implanted with its dose set to $2 \times 10^{15}$ per $cm^2$.

Concerning the impurity dose in this embodiment, when electrically considered, a p-type impurity dose of $1 \times 10^{15}$ per $cm^2$ is set for the P-channel MOS transistor 1, an n-type impurity dose of $1 \times 10^{15}$ per $cm^2$ for the N-channel MOS transistor 2 (of low threshold value) and an n-type impurity dose of $2 \times 10^{15}$ per $cm^2$ for the N-channel MOS transistor 3 (of high threshold value), thus forming the respective diffusion layers. When the dose is physically considered, the impurity is ion implanted with a net dose of $7 \times 10^{15}$ per $cm^2$ for the N-channel (low threshold value) MOS transistor and with a net dose of $7 \times 10^{15}$ $cm^2$ for the N-channel (high threshold value) MOS transistor. In this way, it is possible to set different threshold values.

As has been described in the foregoing, according to the invention it is possible to provide a method of manufacturing MOS semiconductor device and the same MOS semiconductor device, which permits adequate setting and control of threshold voltage, particularly can solve the reverse short channel effect, and permits formation of MOS transistors having different threshold values.

What is claimed is:

1. A method of manufacturing a MOS semiconductor device having at least one P-channel transistor and at least two N-channel transistors with at least two of said N-channel transistors having different threshold voltages, the method comprising the following steps:

applying a photoresist layer to a first n-type impurity region to serve as a first mask, simultaneously implanting p-type impurity ions at a first dose of about $10^{15}/cm^2$ and n-type impurity ions at a second dose of about $10^{15}/cm^2$ onto source and drain regions of a p-type impurity region and a second n-type impurity region, the second dose being less than the first dose, removing the photoresist layer from the first n-type impurity region, applying a photoresist layer to the p-type impurity region to serve as a second mask, implanting impurity ions at a third dose of about $10^{15}/cm^2$ onto source and drain regions of the first and second n-type impurity regions, the third dose being less than the first dose, the first and second n-type impurity regions having impurity doses of n-type impurity ions of less than about $10^{15}/cm^2$.

2. The method of claim 1, further comprising maintaining threshold voltages of the first and second n-type impurity regions at different, but substantially fixed values.

3. The method of claim 2, wherein the threshold voltage of the first n-type impurity region is higher than the threshold voltage of the second n-type impurity region.

4. The method of claim 1, further comprising the step of setting the channel length from about 0.5 $\mu$m to about 4 $\mu$m.

5. The method of claim 1, wherein the implanting step is carried out by an oblique ion implantation process.

6. The method of claim 1, wherein the second and third doses are substantially equal.

* * * * *